United States Patent
West et al.

(10) Patent No.: US 6,580,292 B2
(45) Date of Patent: Jun. 17, 2003

(54) UNIVERSAL PECL/LVDS OUTPUT STRUCTURE

(75) Inventors: Jeffrey Alma West, Albuquerque, NM (US); Robert John Marshall, Morgan Hill, CA (US); Alma Anderson, Rio Rancho, NM (US); Dominicus M Roozeboom, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/922,420

(22) Filed: Aug. 2, 2001

(65) Prior Publication Data

US 2003/0025528 A1 Feb. 6, 2003

(51) Int. Cl.[7] .......................................... H03K 19/0175
(52) U.S. Cl. ............................. 326/83; 326/68; 327/538
(58) Field of Search .............................. 326/83, 82, 86, 326/87, 63, 68–69, 73; 327/538, 541; 323/311–316

(56) References Cited

U.S. PATENT DOCUMENTS 6,005,414 A * 12/1999 Reay ............................ 326/63
6,218,858 B1 * 4/2001 Menon et al. ................ 326/39
6,377,069 B1 * 4/2002 Veenstra et al. .............. 326/38

FOREIGN PATENT DOCUMENTS

| JP | 61114319 A | 6/1986 |
| JP | 639220 A | 1/1988 |
| JP | 06311017 A | 11/1994 |

* cited by examiner

Primary Examiner—Michael Tokar
Assistant Examiner—James H Cho

(57) ABSTRACT

The invention implements a Positive Emitter Coupled Logic (PECL) output using CMOS transistors that approximate the Motorola ECL characteristics into standard PECL termination schemes. By creating a PECL output using a switchable current source the PECL output can be integrated into a Low Voltage Differential Signaling (LVDS) structure. The invention allows the user to switch between PECL and LVDS outputs via control logic by enabling the specific circuit elements for each signaling technology. With this invention, the combination of two drivers on one IC device gives system designers the flexibility to use the same circuitry in two separate signaling schemes. Thus, the designers can select to use one output characteristics or the other for their designs.

19 Claims, 3 Drawing Sheets

UNIVERSAL PECL/LVDS OUTPUT STRUCTURE

BACKGROUND OF THE INVENTION

The invention generally relates to electronic devices, and more particularly to an output structure for PECL (Motorola Positive Emitter Coupled Logic)/LVDS (Low Voltage Differential Signaling) signaling methods.

In telecom and networking systems, signaling methods have been used to route signals from one device to another. In many high speed signaling methods, both PECL and LVDS point-to-point techniques have been used. PECL is a standard developed by Motorola, in which the output node voltages are Vdd−1 volts and Vdd−1.6 volts. On the other hand, LVDS is the EIA-644 standard, in which the output differential voltage swing is ±400 mV. Many designers and manufacturers of telecom and networking system products would like the flexibility to choose either PECL or LVDS signaling levels for their designs. However, due to the performance limitation on LVDS which requires very low capacitance on the output node, the output driver that implements the signaling methods is limited to only one characteristic, i.e., it would have to be either PECL or LVDS, but not both. Otherwise, neither would perform to the PECL/LVDS specifications.

Attempts have been made to combine two output drivers to separately implement PECL and LVDS. Typically, these two output drivers are connected in parallel, and a designer may choose to enable one of the drivers to implement one of PECL and LVDS for a particular design. However, this type of circuit has a number of disadvantages including large size, high cost and inflexibility, etc.

Therefore, there is a need for an output structure that uses the same circuitry to implement the two different signaling schemes on one IC device so as to give designers the flexibility in their designs.

SUMMARY OF THE INVENTION

The invention provides an output structure that uses the same circuitry to implement two different signaling methods, PECL and LVDS, on one IC device. This gives designers the flexibility in their designs.

According to an embodiment of the invention, an output circuit is provided and comprises a first output block having a first output port and a second output block having a second output port. The first and second output blocks are configurable to provide first output characteristics at the first and second output ports compatible with a first signaling method (e.g., the PECL standard), in response to first external control signals. The two output blocks also provide second output characteristics at the first and second output ports compatible with a second signaling method (e.g., the LVDS standard), in response to second external control signals.

According to this embodiment of the invention, the first and second output blocks re substantially identical to each other. Each output block includes a switchable current source that supplies a selected one of a plurality of predetermined currents at its output port, in response to selected external control signals.

With the present invention, the same circuitry is used and functions as two drivers on one IC device. It allows system designers to use the same circuitry in two separate signaling schemes. Thus, the designers can select to use one output characteristics or the other for their designs.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE PREFERRED EMBODIMENTS

Figure 1:
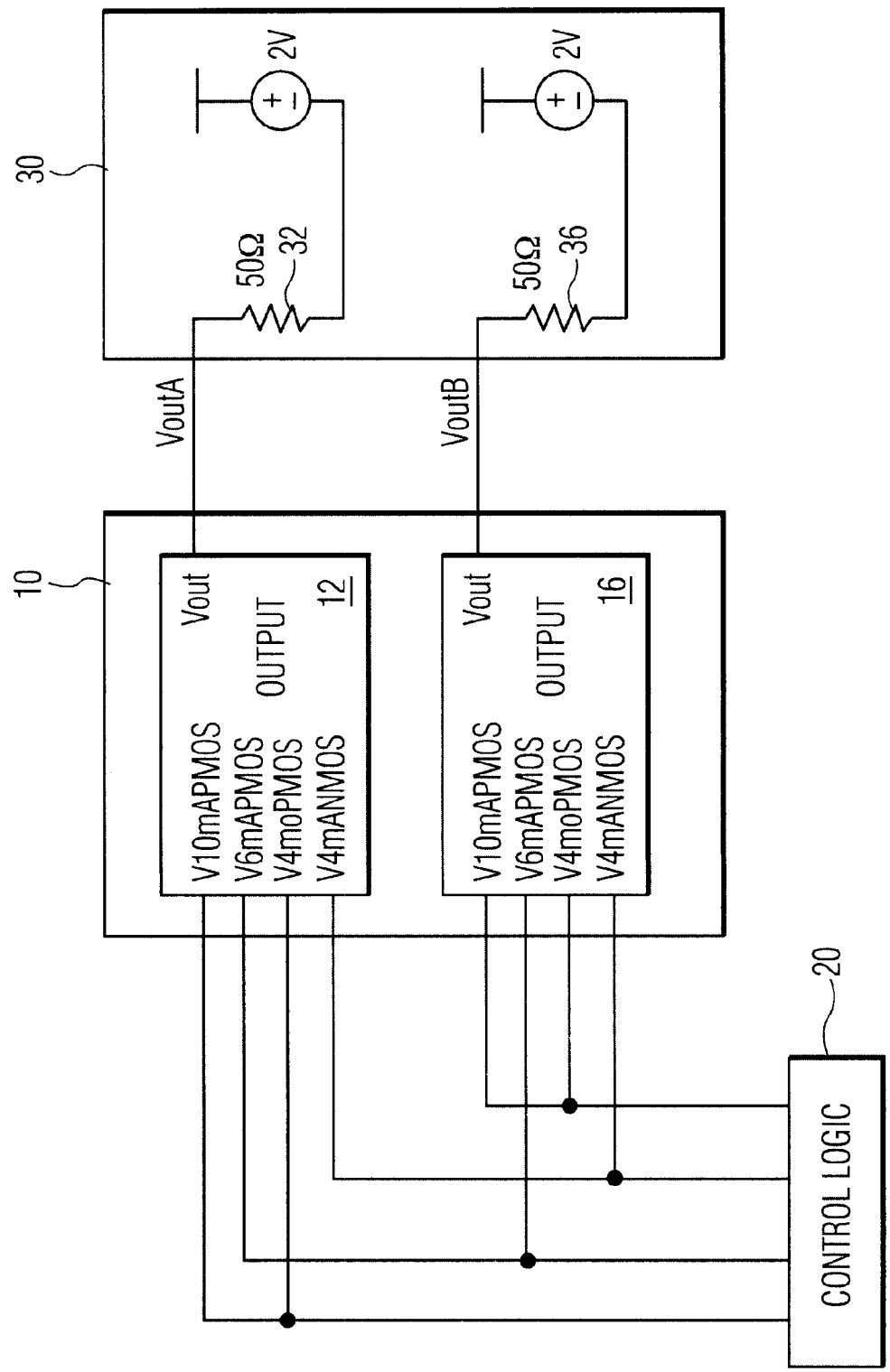
FIG. 1 shows a universal PECL/LVDS output structure according to an embodiment of the invention that is configured to implement a PECL output.

FIG. 1 shows a universal PECL/LVDS output structure 10 according to an embodiment of the invention that is configured to implement a PECL output. In FIG. 1, output structure 10 is connected between control logic 20 and a standard PECL termination circuit 30. Output structure 10 comprises a first output block 12 and a second output block 16. Each of the two output blocks comprises a switchable current source that can supply 4 mA, 6 mA, 10 mA or 20 mA current. Control logic 20 allows a user to switch output structure 10 between PECL and LVDS signaling methods (via outputs VoutA and VoutB) by enabling specific circuit elements for each signaling technology.

Figure 3:
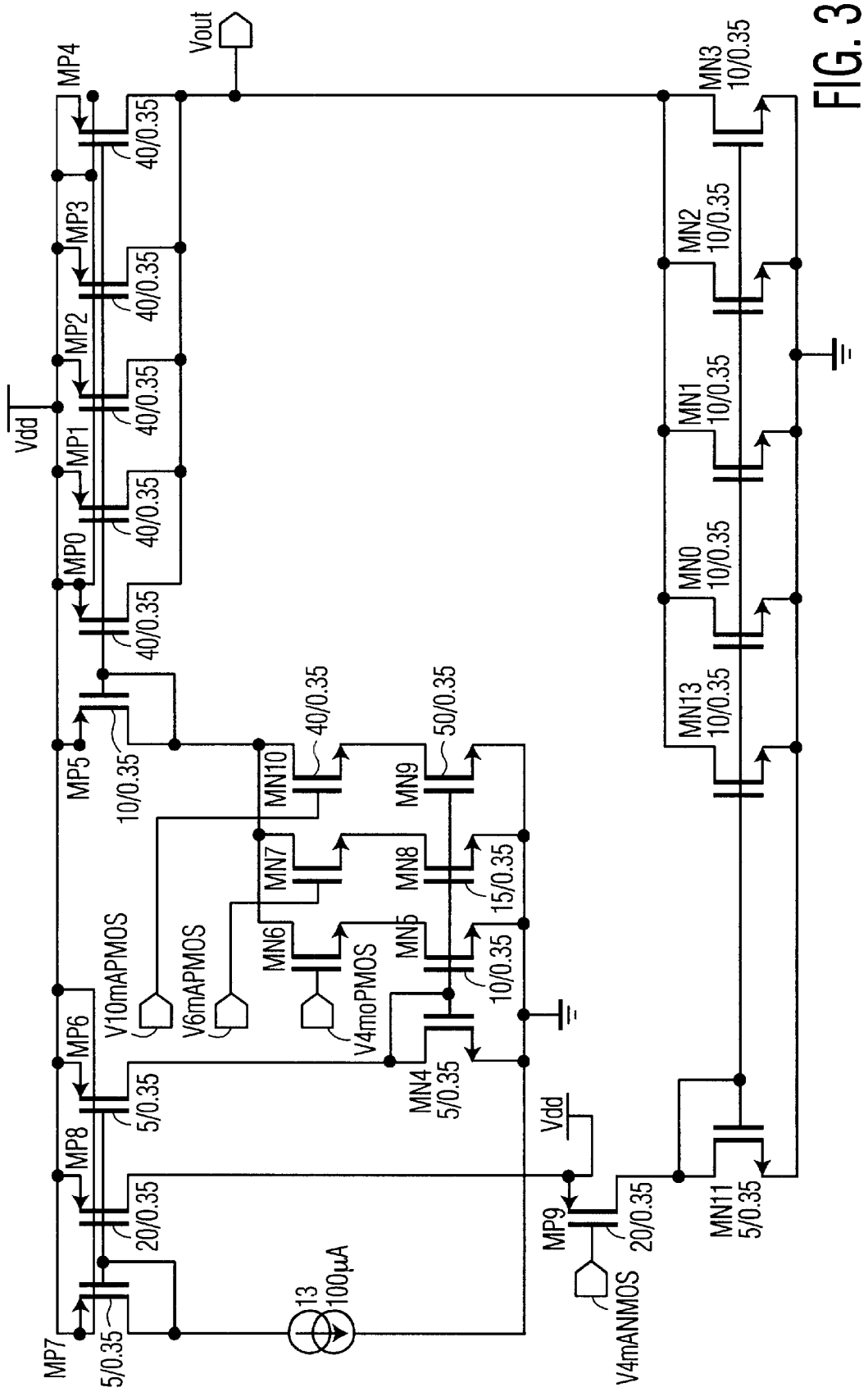
FIG. 3 shows an exemplary schematic diagram of each of the output blocks in FIGS. 1 and 2.

In configuring output structure 10 to implement a PECL output, input signals from control logic 20 set one of the output blocks, e.g., block 12, to a high state so that VoutA is Vdd-1 volts and the other block, e.g., block 16, to a low state so that VoutB is Vdd-1.6 volts. The resulting outputs VoutA and VoutB are compatible with PECL voltage levels. When a block is in a high state, its inputs V10 mAPMOS, V6 mAPMOS and V4 mAPMOS are activated to enable three corresponding current sources, so that the block supplies a total current of 20 mA. When a block is in a low state, the input V6 mAPMOS is activated to enable a corresponding current source so that the block supplies a 6 mA current. The schematic diagram of each block is shown in FIG. 3, which will be described below in detail.

In this embodiment of the invention, the PECL output is implemented using CMOS transistors that approximate the Motorola ECL characteristics into a standard PECL termination circuit 30. PECL termination circuit 30 includes two resistors 32 and 36 each having a resistance value of 50 ohms and being connected to a voltage of Vdd-2 volts. Resistors 32 and 36 can be the Thevenin equivalent resistances. By implementing a PECL output using a switchable current source, the PECL output can be integrated into a LVDS structure as will be described below.

Figure 2:
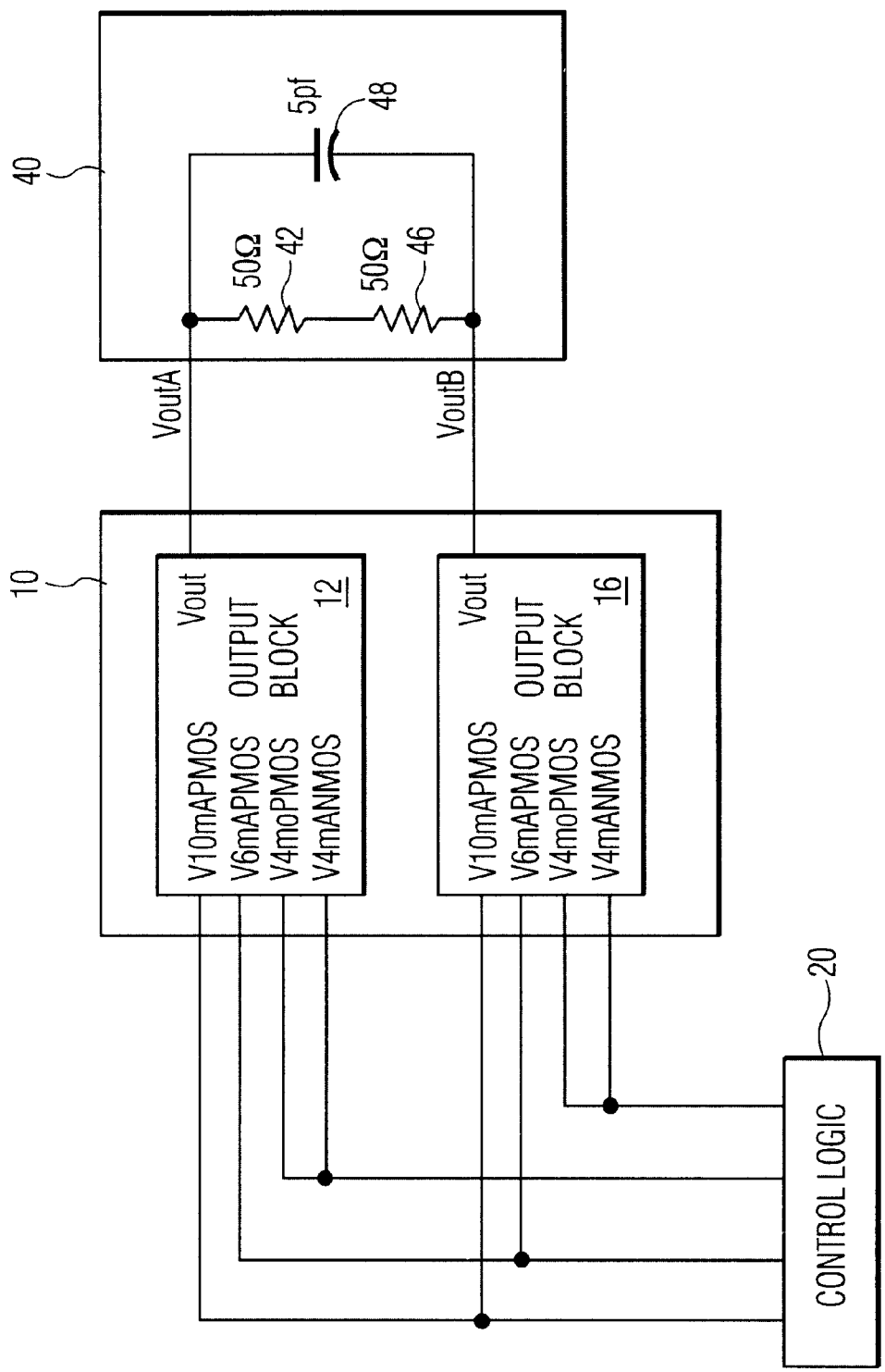
FIG. 2 shows a universal PECL/LVDS output structure that is configured to implement a LVDS output, according to an embodiment of the invention.

FIG. 2 shows universal PECL/LVDS output structure 10 that is configured to implement a LVDS output, according to an embodiment of the invention. In FIG. 2, output structure 10 is connected between control logic 20 and a LVDS termination circuit 40. Termination circuit 40 includes two resistors 42 and 46 connected together in series, each having a resistance value of 50 ohms. A capacitor 48 representing parasitic capacitance is connected in parallel to resistors 42 and 46.

In configuring output structure 10 to implement a LVDS output, input signals from control logic 20 activates the V4 mAPMOS input of one of the blocks, e.g., block 12, and the V4 mANMOS input of the other block, e.g., block 16, so that block 12 pushes a 4 mA current and block 16 sinks a 4 mA current. The resulting differential voltage across resistors 42 and 46 between VoutA and VoutB has a ±400 mV. The LVDS standard has a minimum of 100 mV.

FIG. 3 shows an exemplary schematic diagram of each of output blocks 12 and 16. In this circuit, the NMOS input (V4 mANMOS) and the PMOS inputs (V4 mAPMOS, V6 mAPMOS and V10 mAPMOS) are not activated at the same time. If the NMOS input V4 mANMOS is activated, a 4 mA current is generated at the output Vout. Similarly, if any of the PMOS inputs V4 mAPMOS, V6 mAPMOS and V10 mAPMOS is individually activated, the corresponding current (i.e., 4 mA, 6 mA or 10 mA) is generated at the output. If any combination of the PMOS inputs is activated, a current equal to the sum of the corresponding currents is generated at the output Vout. For example, if all of the three PMOS inputs are activated, a current equal to the sum of the corresponding currents (i.e., 4+6+10) or 20 mA is generated at the output Vout.

The detailed operation of the circuit in FIG. 3 is described next. If input V4 mANMOS is activated, a 400 $\mu$A current (i.e., 4 times the current generated by current source 13) flows through transistor MP8. This 400 $\mu$A is generated via a current mirror composed of transistors MP7 and MP8, based on the ratio of the gate width of MP8 (i.e., 20) and that of MP7 (i.e., 5). This current is again multiplied by a factor of 10 and a resulting 4 mA current is generated at the output Vout via a current mirror composed of transistors MN11, MN13, and MN0–MN3. In a similar manner, this 4 mA is generated based on the ratio of the sum of the gate widths of transistors MN13 and MN0–MN3 (i.e., 10×5) and that of transistor MN11 (i.e., 5).

On the other hand, a 100 $\mu$A current flows through transistor MP6 and is generated by a current mirror composed of transistor MP7 and MP6, based on the ratio of their gate widths (i.e., 5/5). If only input V4 mAPMOS is activated, a 200 $\mu$A current flows through transistor MN5 and is generated by a current mirror composed of transistors MN4 and MN5, based on the ratio of their gate widths (i.e., 10/5). This current is multiplied by a factor of 20 and a resulting 4 mA current is generated at the output Vout. This 4 mA current is generated by a current mirror composed of transistors MP5 and MP0–MP4, based on the ratio of the gate width of MP5 and the sum of the gate widths of MP0–MP4 (i.e., 40×5/10). Similarly, if only input V6 mAPMOS is activated, a 300 $\mu$A current flows through transistor MN8 and is generated by a current mirror composed of transistors MN4 and MN8, based on the ratio of their gate widths (i.e., 15/5). This current is multiplied by a factor 20 in a similar manner and a resulting 6 mA current is generated at the output Vout. Likewise, if only input V10 mAPMOS is activated, a 1 mA current flows through MN9 and is generated by a current mirror composed of transistors MN4 and MN9, based on the ratio of their gate widths (i.e., 50/5). This current is also multiplied by 20 in a similar way and a resulting 20 mA current is generated at the output Vout. If all of the PMOS inputs are activated, a resulting current of 20 mA is generated at the output Vout.

Therefore, the present invention provides flexibility and allows the user to switch between PECL and LVDS by enabling specific circuit elements for each signaling technology.

While the invention has been described in conjunction with specific embodiments, it is evident that many alternatives, modifications and variations will be apparent to those skilled in the art in light of the foregoing description. For example, CMOS or Bipolar CMOS circuits may also be used to implement the present invention. Accordingly, it is intended to embrace all such alternatives, modifications and variations as fall within the spirit and scope of the appended claims.

What is claimed is:

1. An output circuit, comprising:

a first output block having a first output port; and a second output block having a second output port;

wherein the first and second output blocks are configurable to provide first output characteristics at the first and second output ports compatible with a first signaling method, in response to first external control signals, and to provide second output characteristics at the first and second output ports compatible with a second signaling method, in response to second external control signals, and wherein the first signaling method is a Positive Emitter Coupled Logic (PECL) standard, and the second signaling method is a Low Voltage Differential Signaling (LVDS) standard.

2. The circuit of claim 1, wherein each of the first and second output blocks includes a switchable current source that supplies a selected one of a plurality of predetermined currents at its output port, in response to selected external control signals.

3. The circuit of claim 2, wherein the first and second output blocks provide the first output characteristics by supplying approximately 20 mA current at the first output port and approximately 6 mA at the second output port.

4. The circuit of claim 2, wherein the first and second output blocks provide the second output characteristics by supplying approximately 4 mA current at the first output port and 4 mA at the second output port.

5. The circuit of claim 2, wherein the first and second output blocks are substantially identical to each other.

6. An output circuit, comprising:

a first output block having a first output port; and a second output block having a second output port;

wherein the first and second output blocks are configurable to provide first output characteristics at the first and second output ports compatible with a Positive Emitter Coupled Logic (PECL) standard, in response to first external control signals, and to provide second output characteristics at the first and second output ports compatible with a Low Voltage Differential Signaling (LVDS) standard, in response to second external control signals.

7. The circuit of claim 6, wherein the first and second output blocks are substantially identical to each other, and each includes a switchable current source that supplies a selected one of a plurality of predetermined currents at its output port, in response to selected external control signals.

8. The circuit of claim 7, wherein the first and second output blocks provide the first output characteristics by supplying approximately 20 mA current at the first output port and approximately 6 mA at the second output port.

9. The circuit of claim 8, wherein the first and second output blocks provide the second output characteristics by supplying approximately 4 mA current at the first output port and 4 mA at the second output port.

10. An output circuit, comprising:

a first output means having a first output port; and a second output means having a second output port;

wherein the first and second output means are configurable to provide first output characteristics at the first and second output ports compatible with a first signaling method, in response to first external control signals, and to provide second output characteristics at the first and second output ports compatible with a second signaling method, in response to second external control signals, the first signaling method is a Positive Emitter Coupled Logic (PECL) standard, and the second signaling method is a Low Voltage Differential Signaling (LVDS) standard.

11. The circuit of claim 10, wherein each of the first and second output means includes a switchable current source that supplies a selected one of a plurality of predetermined currents at its output port in response to selected external control signals.

12. The circuit of claim 11, wherein the first and second output means provide the first output characteristics by supplying approximately 20 mA current at the first output port and approximately 6 mA at the second output port.

13. The circuit of claim 11, wherein the first and second output means provide the second output characteristics by supplying approximately 4 mA current at the first output port and 4 mA at the second output port.

14. The circuit of claim 11, wherein the first and second output means are substantially identical to each other.

15. A communication system, comprising:

an input circuit;

a main processor circuit connected to the input circuit; and an output circuit connected to the main processor circuit, the output circuit comprising:

a first output block having a first output port, and a second output block having a second output port, wherein the first and second output blocks are configurable to provide first output characteristics at the first and second output ports compatible with a first signaling method, in response to first external control signals, and to provide second output characteristics at the first and second output ports compatible with a second signaling method, in response to second external control signals, and wherein the first signaling method is a Positive Emitter Coupled Logic (PECL) standard, and the second signaling method is a Low Voltage Differential Signaling (LVDS) standard.

16. The system of claim 15, wherein each of the first and second output blocks includes a switchable current source that supplies a selected one of a plurality of predetermined currents at its output port, in response to selected external control signals.

17. The system of claim 16, wherein the first and second output blocks provide the first output characteristics by supplying approximately 20 mA current at the first output port and approximately 6 mA at the second output port.

18. The system of claim 16, wherein the first and second output blocks provide the second output characteristics by supplying approximately 4 mA current at the first output port and 4 mA at the second output port.

19. The system of claim 16, wherein the first and second output blocks are substantially identical to each other.

* * * * *